(12) United States Patent
Aoshima

(10) Patent No.: US 6,627,386 B2
(45) Date of Patent: Sep. 30, 2003

(54) IMAGE FORMING METHOD

(75) Inventor: Keitaro Aoshima, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/740,880

(22) Filed: Dec. 21, 2000

(65) Prior Publication Data

US 2002/0033109 A1 Mar. 21, 2002

(30) Foreign Application Priority Data

Dec. 21, 1999 (JP) .............................. 11-362334

(51) Int. Cl.[7] .............................. G03C 7/00; G03C 7/32; G03C 7/40
(52) U.S. Cl. ................... 430/309; 430/315; 430/325; 430/413
(58) Field of Search ................... 430/309, 315, 430/325, 413

(56) References Cited

U.S. PATENT DOCUMENTS

| 4,716,098 A | | 12/1987 | Mack et al. | |
|---|---|---|---|---|
| 5,244,000 A | * | 9/1993 | Stanford et al. | 134/95.1 |
| 5,597,677 A | * | 1/1997 | Kangas et al. | 430/273.1 |
| 5,633,117 A | | 5/1997 | Barjestch et al. | |
| 5,773,194 A | * | 6/1998 | Hattori et al. | 430/284.1 |
| 5,919,601 A | * | 7/1999 | Nguyen et al. | 430/278.1 |
| 6,174,646 B1 | * | 1/2001 | Hirai et al. | 430/302 |
| 6,197,473 B1 | * | 3/2001 | Kihara et al. | 430/192 |

FOREIGN PATENT DOCUMENTS

| EP | 0 180 122 | 10/1985 |
|---|---|---|
| EP | 0 279 630 | 2/1988 |
| EP | 0 836 120 | 4/1998 |
| JP | 57-5045 | 11/1982 |
| JP | 7-103171 B | 4/1995 |

* cited by examiner

*Primary Examiner*—Janet Baxter
*Assistant Examiner*—Amanda C. Walke
(74) *Attorney, Agent, or Firm*—Burns, Doane, Swecker & Mathis, LLP

(57) ABSTRACT

An image forming method for developing a negative type image forming material after image exposure by an infrared laser. The negative type image forming material is provided with a photosensitive layer, which has sensitivity to an infrared laser. The negative type image forming material is developed with a weak alkaline aqueous solution having a pH in a range from 7 to 12 and containing a carbonate and a surfactant.

12 Claims, No Drawings

IMAGE FORMING METHOD

BACKGROUND OF THE INVENTION

1. Field of the Invention

The present invention relates to an image forming method to be applied with a negative type image forming material suitable for so-called direct plate making, wherein a printing plate can be directly made by infrared laser scanning based on a digital signal of a computer or the like.

2. Description of the Related Art

Conventionally, the following systems have been proposed for directly making a printing plate from digital data of a computer; (1) an electrophotography method; (2) photopolymerization by exposure using a laser that emits blue or green light; (3) a silver salt laminated on a photosensitive resin; (4) a silver salt scattering transfer method; and the like.

However, problems are involved in that (1) the electrophotography method requires complicated image forming processes including charging, exposure, and development. Thus, an apparatus is complicated and bulky. (2) The photopolymerization method requires a printing plate highly sensitive to blue or green light. Thus, handling in an illuminated room is difficult. And methods (3) and (4) require complicated processes because of the use of the silver salt, such as development. Moreover, silver is contained in processing waste liquid.

In contrast, development in the field of lasers has been significant recently. In particular, solid lasers and semiconductor lasers that emit infrared ray of a 760 nm to 1,200 nm wavelength and that have a high output and a small size are now easily obtainable. As a recording light source at a time of directly making a printing plate from digital data of a computer or the like, such lasers are extremely useful. However, since most photosensitive recording materials in practical use have an exposing wavelength of 760 nm or less in the visible light range, these infrared lasers cannot be used for forming an image thereon. Therefore, a material recordable with an infrared laser is called for.

As such an image recording material recordable with an infrared laser, U.S. Pat. No. 4,708,925 discloses a recording material containing an onium salt, a phenol resin, and a spectral sensitizer. The image recording material is a positive type image recording material that utilizes a dissolution restraining effect with respect to a developer, which effect is caused by the onium salt and the phenol resin. Thus, the material is not of a negative type, unlike the material of the present invention. In contrast, U.S. Pat. No. 5,340,699 discloses a negative type image recording material containing an infrared ray absorbing agent, an acid generating agent, a resol resin and a novolak resin. In such a negative type image recording material, in general, an image is formed by developing with an alkaline aqueous solution after laser exposure of the image. In this developing process, an automatic developing machine is generally used For example, Japanese Patent Application Laid-Open (JP-A) No. 8-108621 discloses a negative type image forming material using a photopolymerizable composition, wherein a strong alkaline aqueous solution containing potassium silicate and having a pH value of more than 12 or the like is used for development. Such a developer having a high pH value involves a problem in that the developer absorbs carbon dioxide from air in the automatic developing machine, and a degree of activity of the developer deteriorates with aging.

Further, Japanese Patent Application Publication (JP-B) No. 7-103171 discloses a recording material that does not need a heat treatment after image exposure, containing a cyanine dye having a specific structure, an iodonium salt, and an addition polymerizable compound having an ethylenically unsaturated double bond. This image recording material is developed with a weak alkaline aqueous solution using a carbonate as an alkaline agent. A developer that uses a carbonate is preferable because such a developer does not absorb carbon dioxide in the air, but this developer has a problem in that it has poor solubility with respect to the image recording material. Thus, the photosensitive layer cannot be eliminated completely and fouling may occur in a non-image portion during printing.

In order to improve the solubility of the developer that uses the carbonate with respect to the image recording material, a technique of adding an organic solvent such as benzil alcohol was studied. However, when this solvent is included, although the solubility of the photosensitive layer is improved, there is a problem in that an image portion is also influenced, which reduces printing durability.

SUMMARY OF THE INVENTION

Accordingly, an object of the present invention is to provide an image forming method for application to a negative type image forming material that can be directly recorded with digital data from a computer, by recording with a solid laser or semiconductor laser that emits infrared radiation. Due to the method, image forming properties are excellent and characteristics of a developer do not cause an aging-related reduction in a developing property or a reduction in printing durability.

As a result of in-depth study by the present inventor of physical properties of the negative type image forming material and the developer, it was discovered that the above-mentioned problems can be solved by improving permeability at a non-image portion of a photosensitive layer and utilizing characteristics of a developer containing a carbonate. Thus, the present invention could be achieved.

That is, a first aspect of the present invention is an image forming method which includes the steps of: preparing a negative type image forming material including a supporting member and at least one photosensitive layer which has sensitivity to an infrared laser; exposing the negative type image forming material image-wise by an infrared laser; and developing the negative type image forming material with a weak alkaline aqueous solution having a pH value in a range from 7 to 12 and containing a carbonate and a surfactant.

A second aspect of the present invention is an image forming method which includes the steps of: preparing a negative type image forming material including a supporting member and at least one photosensitive layer containing (A) an infrared ray absorbing agent, (B) a radical generating agent, (C) a radically polymerizable compound, and (D) a binder polymer; exposing the negative type image forming material image-wise by an infrared laser; and developing the negative type image forming material with a weak alkaline aqueous solution having a pH value in a range from 7 to 12 and containing a carbonate and a surfactant.

Although not defined, the reasons for the excellent effects of the present invention are considered as follows. Due to use of a surfactant in an alkaline developer containing a carbonate, development failure caused by deterioration of the developing property, which is caused by absorption of carbon dioxide, can be improved, and the permeability of the developer with respect to the non-image portion of the photosensitive layer can be improved. Further, due to controlling a pH value to within a 7 to 12 weak alkaline range, damage of the image portion of the photosensitive layer is improved, and adverse effects on the printing durability can be prevented.

DESCRIPTION OF THE PREFERRED EMBODIMENTS

Hereinafter the present invention will be explained in detail.

An image forming method according to the present invention is characterized by an alkaline aqueous solution used in development.

As a base for a developer and for a replenisher, which are used in an image forming method of the present invention, a weak alkaline aqueous solution in a 7 to 12 pH range, which solution contains a carbonate and a surfactant, is used.

The weak alkaline aqueous solution used in a developing step of the image forming method of the present invention is required to be in a 7 to 12 pH range, and preferably in an 8 to 11 pH range. In the present invention, pH values refer to values measured at 25° C.

Examples of carbonates preferably used in the method of the present invention include carbonates and hydrogen carbonates of alkaline metals, carbonates and hydrogen carbonates of alkaline earth metals, and carbonates and hydrogen carbonates of ammonium. In particular, sodium carbonate, sodium hydrogen carbonate, potassium carbonate, potassium hydrogen carbonate and the like are particularly preferable. These carbonates and hydrogen carbonates can be used as either an anhydride or a hydrate. Moreover, two or more kinds of carbonates and hydrogen carbonates can be used in combination.

An amount of the carbonate with respect to the developer or replenisher is preferably 0.1 to 10% by weight, more preferably 0.2 to 8.5% by weight, and further preferably 0.3 to 7% by weight. With an amount less than 0.1% by weight, fouling tends to occur at a non-image portion during printing after image formation, and with an amount more than 10% by weight, printing durability failure tends to occur at the time of printing, and thus neither of these condition is preferable.

For the developer used in the method of the present invention, in addition to the above-mentioned carbonate, other known alkaline agents can be used for pH adjustment and other purposes, when the provided effects of the present invention are not disrupted. Specific examples include inorganic alkaline agents such as sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate, and ammonium borate; potassium citrate; tripotassium citrate; sodium citrate; sodium silicate; potassium citrate and the like.

Further suitable examples include organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine and the like.

A developer to be used in the method of the present invention must contain a surfactant. The surfactant is useful for promoting developing properties, and for improving dispersal of development residue and an ink affinity property. The surfactant used in the present invention is not particularly limited, and any of anionic, cationic, nonionic, and amphoteric surfactants can be used.

Preferable examples of the surfactant include nonionic surfactants such as polyoxyethylene alkylethers, polyoxyethylene alkylphenylethers, polyoxyethylene polystyrylphenylethers, polyoxyethylene polyoxypropylene alkylethers, glycerol fatty acid partial esters, sorbitan fatty acid partial esters, pentaerythritol fatty acid partial esters, propylene glycol monofatty acid esters, cane sugar fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylene castor oils, polyoxyethylene glycerol fatty acid partial esters, fatty acid diethanolamides, N,N-bis-2-hydroxyalkylamines, polyoxyethylene alkylamine, triethanolamine fatty acid ester, and trialkylamine oxide and the like; anionic surfactants such as fatty acid salts, abietates, hydroxyalkane sulfonates, alkanesulfonates, dialkylsulfosuccinates, straight chain alkylbenzene sulfonates, branched chain alkylbenzene sulfonates, alkylnaphthalene sulfonates, alkylphenoxy polyoxyethylene propylsulfonates, polyoxyethylene alkylsulfophenyl ether salts, sodium N-methyl-N-oleyltaurinates, N-alkylsulfosuccinic acid monoamide disodium salts, petroleum sulfonates, sulfatedcastoroil, sulfated beef tallow, sulfuric acid ester salts of fatty acid alkylesters, alkyl sulfuric acid ester salts, polyoxyethylene alkylether sulfuric acid ester salts, fatty acid monoglyceride sulfuric acid ester salts, polyoxyethylene alkylphenyl ether sulfuric acid ester salts, polyoxyethylene styrylphenyl ether sulfuric acid ester salts, alkylphosphoric acid ester salts, polyoxyethylene alkyl ether phosphoric acid ester salts, polyoxyethylene alkylphenyl ether phosphoric acid ester salts, partial saponified products of styrene-maleic anhydride copolymers, partial saponified products of olefin-maleic anhydride copolymers, and naphthalene sulfonate formalin condensed products and the like; cationic surfactants such as alkylamine salts, quaternary ammonium salts, polyoxyethylene alkylamine salts, and polyethylene polyamine derivatives and the like; and amphoteric surfactants such as carboxybetaines, aminocarboxylic acids, sulfobetaines, aminosulfates, imidazolines and the like.

In the above-mentioned examples of surfactants, "polyoxyethylene" also represents polyoxyalkylenes such as polyoxymethylene, polyoxypropylene, polyoxybutylene and the like, and such surfactants are also included as examples.

Of the examples, the anionic surfactants are preferable because they provide good permeability and have a good property for dispersal of photosensitive layer components in the developer after development. In particular, sulfonates or anionic activating agents including a monosulfate are preferable.

An amount of the surfactant with respect to the developer is preferably 0.2 to 30% by weight, and more preferably 0.5 to 20% by weight. With an amount less than 0.2% by weight, fouling can occur at the non-image portion, and with an amount more than 30% by weight, printing durability is reduced, and thus neither of these conditions is preferable.

Moreover, a known additive can be added to the developer to be used in the present invention as needed, so far as provided the effects of the present invention are not disrupted. Examples of the additives include reducing agents such as hydroquinone, resorcin, sodium or potassium salts of inorganic acids (such as sulfurous acid, hydrogen sulfurous acid and the like) and the like; organic carboxylic acid; anti-foaming agents; hard water softeners and the like.

However, even an additive for promoting developing properties, an organic solvent such as benzyl alcohol or the like may affect the printing durability. Therefore, it is preferable that a developer to be used in the present invention substantially does not contain an organic solvent.

It is known that in a case of developing in an automatic developing machine, a large amount of planographic printing plates can be processed over a long time without need of replacing the developer in the developing tank if an aqueous solution (replenisher) with an alkalinity higher than that of the developer is added to the developer. This replenishing method is preferably adopted in the present invention. The pH value of the aqueous solution used in the replenisher is from 7 to 12, and preferably in the range of 8 to 11.

The image forming method according to the present invention is applied with a negative type image forming material having a supporting member with a photosensitive layer formed thereon. The layer contains (A) an infrared ray absorbing agent, (B) a radical generating agent, (C) a radically polymerizable compound, and (D) a binder polymer.

Here, the negative type image forming material will be explained. The image forming material includes the photosensitive layer containing (A) the infrared ray absorbing agent, (B) the radical generating agent, (C) the radically polymerizable compound, and (D) the binder polymer. In the photosensitive layer of an image forming material, due to image exposure by an infrared laser, heat is generated by photothermal conversion of (A) the infrared ray absorbing agent at an exposed portion. The heat decomposes (B) the radical generating agent to generate radicals. Next, the photosensitive layer, which contains (C) the radically polymerizable compound and (D) the binder polymer, is cured by the radicals to form the image portion. Thereafter, by developing with the above-mentioned weak alkaline aqueous solution, an uncured and unexposed portion of the photosensitive layer is eliminated to form the non-image portion.

In the present invention, the method may further comprise another steps. Examples include a step of preparing a photosensitive layer coating liquid, a step of coating a photosensitive layer coating liquid on a supporting member, a step of drying a photosensitive layer coating liquid that has been applied on a supporting member to thereby obtain the negative type image forming material, a step of performing a post-treatment after development and the like.

Each component of the photosensitive layer will be explained in turn.

[(A) The Infrared Ray Absorbing Agent]

The object of the present invention is to record an image with a laser emitting infrared ray. Therefore, use of the infrared ray absorbing agent is a prerequisite. The infrared ray absorbing agent has a function of converting absorbed infrared ray or near-infrared ray to heat. By the heat generated at this time, the radical generating agent is decomposed to generate radicals. The infrared ray absorbing agent used in the present invention is a dye or a pigment having a maximum absorption in a 760 nm to 1,200 nm wavelength range.

As this dye, commercially available dyes and known dyes disclosed in the literature, such as "Senryobinran" ("Dye Handbook") (edited by Yukigoseikagaku Kyokai, published in 1970) can be used. Specific examples of such dyes include azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium pigments, pyrilium salts, metal thiolate complexes and the like.

Examples of preferable dyes include cyanine dyes disclosed in Japanese Patent Application Laid-Open (JP-A) Nos. 58-125246, 59-84356, 59-202829, and 60-78787 and the like; methine dyes disclosed in JP-A Nos. 58-173696, 58-181690, and 58-194595 and the like; naphthoquinone dyes disclosed in JP-A Nos. 58-112793, 58-224793, 59-48187, 59-73996, 60-52940, and 60-63744 and the like; squarylium dyes disclosed in JP-A No. 58-112792 and the like; and a cyanine dye disclosed in Great Britain Patent No. 434,875.

Moreover, a near-infrared absorbing sensitizer disclosed in U.S. Pat. No. 5,156,938 can also be used preferably. Furthermore, a substituted arylbenzo(thio)pyrylium salt disclosed in U.S. Pat. No. 3,881,924, a trimethinethiapyrylium salt disclosed in JP-A No. 57-142645 (U.S. Pat. No. 4,327, 169), pyrylium compounds disclosed in JP-A Nos. 58-181051,58-220143, 59-41363,59-84248, 59-84249, 59-146063, and 59-146061, a cyanine dye disclosed in JP-A No. 59-216146, a pentamethinethiopyrylium salt disclosed in U.S. Pat. No. 4,283,475, and pyrylium compounds disclosed in Japanese Patent Application Publication (JP-B) Nos. 5-13514, and 5-19702 can also be used preferably.

Moreover, other examples of preferable dyes include near-infrared absorbing dyes represented by formulae (I) and (II) disclosed in U.S. Pat. No. 4,756,993.

Of these examples of dyes, the cyanine pigments, the squarylium pigments, the pyrylium salts, and the nickel thiolate complexes are particularly preferable. Furthermore, the cyanine pigments are preferable and, in particular cyanine pigments represented by general formula (I) below is most preferable.

General formula (I)

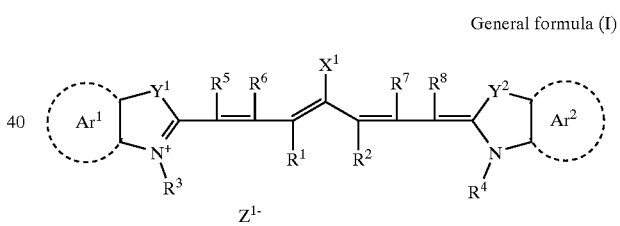

In the general formula (I), $X^1$ represents a halogen atom, or $X^2-L^1$. Here, $X^2$ represents an oxygen atom or a sulfur atom, and $L^1$ represents a hydrocarbon group having 1 to 12 carbon atoms. $R^1$ and $R^2$ each independently represent a hydrocarbon group having 1 to 12 carbon atoms. In view of storage stability of a photosensitive layer coating liquid, it is preferable that $R^1$ and $R^2$ are hydrocarbon groups having two or more carbon atoms. It is particularly preferable that $R^1$ and $R^2$ are bonded with each other so as to form a five-membered ring, or a six-membered ring.

$Ar^1$ and $Ar^2$, which can either be the same or different, each denote an aromatic hydrocarbon group, which may have a substituent. Preferable examples of aromatic hydrocarbon groups include a benzene ring and a naphthalene ring. Moreover, examples of preferable substituents include a hydrocarbon group having 12 or less carbon atoms, a halogen atom, and an alkoxy group having 12 or less carbon atoms. $Y^1$ and $y^2$, which can either be the same or different, denote a sulfur atom or a dialkylmethylene group having 12 or less carbon atoms. $R^3$ and $R^4$, which can either be the same or different, denote a hydrocarbon group, which may have a substituent, having 20 or less carbon atoms.

Examples of preferable substituents include an alkoxy group having 12 or less carbon atoms, a carboxyl group, and a sulfo group. $R^5$, $R^6$, $R^7$ and $R^8$, which may either be the same or different, denote a hydrogen atom or a hydrocarbon atom having 12 or less carbon atoms. In view of material availability, the hydrogen atom is preferable. Moreover, $Z^1$ represents a pair anion. However, in a case wherein a sulfo group is substituted at any of $R^1$ to $R^8$, $Z^{1-}$ is not required. In view of the storage stability of the photosensitive layer coating liquid, examples of preferable $Z^{1-}$ include a halogen ion, a perchloric acid ion, a tetrafluoroborate ion, a hexafluorophosphate ion, a sulfonic acid ion and the like. Particularly preferable are a perchloric acid ion, a hexafluorophosphate ion, or an arylsulfonic acid ion.

As specific examples of cyanine dyes represented by the general formula (I) preferably used in the present invention includes those disclosed in paragraph Nos. [0017] to [0019] of JP-A No. 11-310623.

As the pigment used in the present invention, commercially available pigments and the pigments disclosed in Color Index (C. I.) Handbooks, "Saishin Ganryo Binran" ("Modern Pigment Handbook") (edited by Nihon Ganryo Gijutsu Kyokai, published in 1977), "Saishin Ganryo Oyo Gijutsu" ("Modern Pigment Application Technology") (CMC Publishing Co., published in 1986), and "Insatsu Ink Gijutsu" ("Printing Ink Technology") (CMC Publishing Co., published in 1984) can be used.

Examples of pigment include a black pigment, a yellow pigment, an orange pigment, a brown pigment, a red pigment, a purple pigment, a blue pigment, a green pigment, a fluorescent pigment, a metal powder pigment, and a polymer bonded pigment. Specifically, an insoluble azo pigment, an azo lake pigment, a condensed azo pigment, a chelate azo pigment, a phthalocyanine based pigment, an anthraquinone based pigment, perylene and perynone based pigments, a thioindigo based pigment, a quinacridone based pigment, a dioxazine based pigment, an isoindolinone based pigment, a quinophthalone based pigment, an in-mold decorating lake pigment, an azine pigment, a nitroso pigment, a nitro pigment, a natural pigment, a fluorescent pigment, an inorganic pigment, carbon black or the like can be used. Among these examples of pigments, carbon black is preferable.

These pigments can be used without applying a surface treatment, or after application of a surface treatment. As a surface treatment method, a method of coating a resin or a wax on the surface, a method of adhering a surfactant, a method of bonding a reactive substance (such as a silane coupling agent, an epoxy compound, or a polyisocyanate) to the pigment surface, and the like, can be considered. The above-mentioned surface treatment methods are disclosed in "Kinzoku Sekken no Seishitsu to Oyo" ("Natures and Applications of Metal Soaps") (Saiwai Publishing Co.), "Insatsu Ink Gijutsu" ("Printing Ink Technology") (CMC Publishing Co., published in 1984) and "Saishin Ganryo Oyo Gijutsu" ("Modern Pigment Application Technology"), (CMC Publishing Co., published in 1986).

A particle size of the pigment is preferably in a 0.01 μm to 10 μm range, more preferably in a 0.05 μm to 1 μm range, and particularly preferably in a 0.1 μm to 1 μm range. A pigment particle size of less than 0.01 μm is not preferable in view of stability of dispersion in the image photosensitive layer coating liquid. In contrast, a pigment particle size of more than 10 μm is not preferable in view of uniformity of the image photosensitive layer.

As a method for dispersing the pigment, known dispersing techniques used in ink production, toner production and the like can be used. Examples of a dispersing apparatus include an ultrasonic dispersing machine, a sand mill, an attritor, a pearl mill, a super mill, a ball mill, an impeller, a disperser, a KD mill, a colloid mill, a dynatron, a triple roll mill, and a pressure kneader. Details are disclosed in "Saishin Ganryo Oyo Gijutsu" ("Modern Pigment Application Technology") (CMC Publishing Co., published in 1986).

The infrared ray absorbing agent can be added in one layer with other components, or be added to another layer which is prepared for the infrared ray absorbing agent. It is preferable that a photosensitive layer has an optical density between 0.1 and 3.0 at an absorption maximum thereof which exist in 760 nm to 1,200 nm wavelength range, when a negative type planographic printing plate is produced in the present invention. If the optical density is outside the range, sensitivity will tend to be low. Since the optical density is determined by the amount of the infrared ray absorbing agent and the thickness of the recording layer, a predetermined optical density can be obtained by controlling these conditions. The optical density of the recording layer can be measured by an ordinary method. Examples of measurement methods include a method of forming a recording layer which has a coating amount of a determined optimal thickness in a range necessary for a planographic printing plate after drying thereof, on a transparent or white supporting member, and measuring with a transmission type optical densitometer, and a method of forming a recording layer on a reflective supporting member such as aluminum, and measuring a reflection density.

[(B) Radical Generating Agent]

A radical generating agent used in the present invention represents a compound to be used in combination with the infrared ray absorbing agent (A) to generate radicals at the time of radiation from the infrared laser. Examples of the radical generating agent include onium salts, a triazine compounds having a trihalomethyl group, peroxides, azo based polymerization initiators, azido compounds, and quinone diazides. The onium salts are preferable for high sensitivity thereof.

An onium salt preferably used as a radical polymerization initiator of the present invention will be explained. Examples of preferable onium salts include iodonium salts, diazonium salts, and sulfonium salts. These onium salts function not as an oxygen generating agent but as a radical polymerization initiator. Onium salts preferably used in the present invention are represented by the general formulae (III) to (V) below.

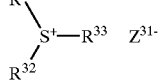

General formula (III)

General formula (IV)

General formula (V)

In the formula (III), $Ar^{11}$ and $Ar^{12}$ each denote an aryl group having 20 or less carbon atoms, which may have a substituent, independently from each other. Examples of a preferable substituent in a case wherein the aryl group has a substituent include a halogen atom, a nitro group, an alkyl group having 12 or less carbon atoms, an alkoxy group having 12 or less carbon atoms, and an aryloxy group having 12 or less carbon atoms. $Z^{11-}$ denotes a pair ion selected from the group consisting of a halogen ion, a perchloric acid ion, a tetrafluoroborate ion, a hexafluorophosphate ion, and a sulfonic acid ion. Preferably $Z^{11-}$ is a perchloric acid ion, a hexafluorophosphate ion, or an aryl sulfonic acid ion.

In the formula (IV), $Ar^{21}$ denotes an aryl group having 20 or less carbon atoms, which may have a substituent. Examples of a preferable substituent in a case wherein the aryl group has a substituent include a halogen atom, a nitro group, analkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, and a diarylamino group having 12 or less carbon atoms. $Z^{21-}$ denotes a pair ion similarly to $Z^{11-}$.

In the formula (V), $R^{31}$, $R^{32}$ and $R^{33}$, which may either be the same or different, each denote a hydrocarbon group having 20 or less carbon atoms, which may have a substituent. Examples of a preferable substituent include a halogen atom, a nitro group, an alkyl group having 12 or less carbon atoms, an alkoxy group having 12 or less carbon atoms, and an aryloxy group having 12 or less carbon atoms. $Z^{31}$ denotes a pair ion similarly to $Z^{11-}$.

Specific examples of onium salts preferably used as the radical generating agent in the present invention include those disclosed in paragraph Nos. [0030] to [0033] of JP-A No. 11-310623.

A radical generating agent used in the present invention preferably has a maximum absorption wavelength of 400 nm or less, and more preferably 360 nm or less. By providing this absorption wavelength in the ultraviolet region accordingly, the planographic printing plate can be handled under white light.

The radical generating agent can be added in a photosensitive layer coating liquid at 0.1 to 50% by weight, preferably 0.5 to 30% by weight, and particularly preferably 1 to 20% by weight with respect to total solids of the photosensitive layer coating liquid. With an amount less than 0.1% by weight, sensitivity is lowered, and with an amount more than 50% by weight, image fouling occurs at the non-image portion. These radical generating agents can be used alone or in a combination of two or more. The radical generating agents can be added in one layer with other components, or can be added to another layer which is prepared for the radical generating agents.

[(C) Radically Polymerizable Compound]

The radically polymerizable compound used in the present invention contains at least one ethylenically unsaturated double bond, and is selected from compounds having at least one, and preferably two or more end ethylenically unsaturated double bonds. Such a compound group is widely known in this industrial field, and such compounds can be used in the present invention without a particular limit. These compounds have chemical forms such as, for example, a monomer, a prepolymer, such as a dimer, a trimer or an oligomer, a mixture thereof, a polymer thereof. Examples of monomers and copolymers include unsaturated carboxylic acids (such as acrylic acid, methacrylic acid, itaconic acid, chrotonic acid, isochrotonic acid, and maleic acid), esters thereof, and amides thereof. Esters of an unsaturated carboxylic acid and an aliphatic polyhydric alcohol compound, or amides of an unsaturated carboxylic acid and an aliphatic polyvaleic amine compound can be used preferably. Moreover, an unsaturated carboxylic acid ester having a nucleophilic substituent such as a hydroxyl group, an amino group, or a mercapto group or the like; an addition reaction product of amides and monofunctional or polyfunctional isocyanates, or epoxys; or a dehydration condensation reaction product of amides and a monofunctional or polyfunctional carboxylic acid or the like can also be used preferably. Furthermore, an addition reaction product of an unsaturated carboxylic acid esters or amides having an electrophilic substituent, such as an isocyanate group or an epoxy group, and a monofunctional or polyfunctional alcohols, amines or thiols, and further, a substitution reaction product of an unsaturated carboxylic acid esters or amides having an elimination substituent such as a halogen group or a tosyloxy group and a monofunctional or polyfunctional alcohols, amines, or thiols can also be used preferably. Moreover, as another example, a compound group with the above-mentioned unsaturated carboxylic acid replaced by an unsaturated phosphonic acid, styrene, or the like, can be used.

Specific examples of acrylic acid esters, methacrylic acid esters, itaconic acid esters, crotonic acid esters, isocrotonic acid esters, and maleic acid esters as an ester of an aliphatic polyhydric alcohol compound and an unsaturated carboxylic acid are disclosed in paragraph Nos. [0037] to [0042] of JP-A No. 11-310623, and the same can be applied in the present invention.

As other examples of esters, aliphatic alcohol based esters disclosed in JP-B Nos. 46-27926 and 51-47334, and JP-A No. 57-196231, esters having an aromatic group-based skeleton structure disclosed in JP-A Nos. 59-5240,59-5241, and2-226149, and esters containing an amino group disclosed in JP-A No. 1-165613 can also be used preferably.

Moreover, specific examples of monomers of amides which is obtained from aliphatic polyvaleic amine compounds and unsaturated carboxylic acids include methylene bis-acryl amide, methylene bis-methacryl amide, 1,6-hexamethylene bis-acryl amide, 1,6-hexamethylene bis-methacryl amide, diethylene triamine trisacryl amide, xylylenebisacryl amide, and xylylene bis methacryl amide.

Other examples of preferable amide based monomers include those having a cyclohexylene structure disclosed in JP-B No. 54-21726.

Moreover, urethane based addition polymerization compounds produced utilizing an addition reaction of an isocyanate and a hydroxyl group are also preferable. Specific examples thereof include vinyl urethane compounds containing two or more polymerizable vinyl groups in a molecule, prepared by adding a vinyl monomer containing a hydroxyl group represented by formula (VI) below to a polyisocyanate compound having two or more isocyanate groups in a molecule, as disclosed in JP-B No. 48-41708.

$$CH_2=C(R^{41})COOCH_2CH(R^{42})OH \qquad \text{General formula (VI)}$$

(wherein $R^{41}$ and $R^{42}$ denote H or $CH_3$).

Moreover, urethane acrylates disclosed in JP-A No. 51-37193, and JP-B Nos. 2-32293 and 2-16765, and urethane compounds having an ethylene oxide based skeleton structure disclosed in JP-B Nos. 58-49860, 56-17654, 62-39417, and 62-39418 are also preferable.

Furthermore, Radical polymerizable compounds having an amino structure or a sulfide structure in a molecule disclosed in JP-A Nos. 63-277653, 63-260909, and 1-105238 can also be used.

Other examples include polyfunctional acrylates and methacrylates such as the polyester acrylates and epoxy acrylates prepared by reaction of an epoxy resin and a (meth)acrylic acid as disclosed in JP-A No. 48-64183, and JP-B Nos. 49-43191 and 52-30490. Moreover, specific unsaturated compounds disclosed in JP-B Nos. 46-43946, 1-40337, and 1-40336, and a vinyl phosphonic acid based compound disclosed in JP-A No. 2-25493 can also be presented. Furthermore, in some cases, a structure containing a perfluoroalkyl group disclosed in JP-A No. 61-22048 can be used preferably. Moreover, compounds presented in the Nihon Secchaku Gyokaishi (Japan Bonding Association Journal) vol. 20, No. 7, page 300 to 308 (1984) as photocuring monomers and oligomers can be used as well.

Details of usage of these radical polymerizable compounds, such as the structure thereof, use alone or in a combination, and addition amount can be set optimally according to final design characteristics of the recording material. For example, they are selected from the following viewpoints. In terms of the sensitivity, a structure with a large unsaturated group content per molecule is preferable. In most cases, structures that are bifunctional or more are preferable. Moreover, for improving strength of the image portion, that is, the hardened film, structures that are trifunctional or more are preferable. Furthermore, a method of using compounds having different functional numbers and/or different polymerizable groups (such as acrylic acid ester based compounds, methacrylic acid ester based compounds, and styrene based compounds) in combination is effective for adjusting both photosensitivity and strength. Although compounds of large molecular weight and compounds of high hydrophobic property have excellent sensitivity and film strength, they may not be preferable in some cases in terms of developing speed and precipitation in a developer. Moreover, also in terms of compatibility and dispersing property with other components in the photosensitive layer (such as a binder polymer, an initiator, and a coloring agent), selection and usage of the radical polymerizable compounds are important factors. For example, the compatibility may be improved by the use of a low purity compound or by the use of a combination of two or more compounds. Furthermore, a specific structure of the radical polymerizable compound may be selected for improving an adhesion property of a supporting member, an overcoat layer, or the like. As to a composition ratio of the radical polymerizable compound in the image recording layer, a larger ratio is advantageous in terms of the sensitivity. However, in a case wherein the ration is too large, unpreferable phase separation, problems in the production step due to a sticking property of the image recording layer (such as transfer of a recording layer component, or production failure derived from sticking), or a problem of precipitation of the radical polymerizable compound from the developer may occur. In view of the above, a preferable composition ratio of the radical polymerizable compound is, in most cases, 5 to 80% by weight with respect to the total composition, and preferably 20 to 75% by weight. Moreover, the radical polymerizable compound can be used alone or in a combination of two or more. Moreover, as to the usage of the radical polymerizable compound, appropriate structure, composition, and amount can be selected optimally in view of a degree of polymerization interference with respect to oxygen, resolution, a fogging property, a refractive index variation, and a surface sticking property. Furthermore, a layer structure and a coating method for them such as undercoating or top coating can also be executed.

[(D) Binder Polymer]

In the present invention, the binder polymer is further used. As the binder, a linear organic polymer is preferably used. Any "linear organic polymer" can be used. In order to realize water development or weak alkaline water development, a linear organic polymer that is soluble or swellable with respect to water or weak alkaline water is preferably selected. The linear organic polymer is selected and used not only as a film forming agent for forming the photosensitive layer but also, according to the application, as a material utilized with water, weak alkaline water, or organic solvent developer. For example, by use of a water soluble organic polymer, water development can be enabled. Examples of the linear organic polymer include radical polymers having a carboxylic acid group in a side chain, such as those disclosed in JP-A No. 59-44615, JP-B Nos. 54-34327, 58-12577, 54-25957, and JP-A Nos. 54-92723, 59-53836, and 59-71048: that is, methacrylic acid copolymers, acrylic acid copolymers, itaconic acid copolymers, crotonic acid copolymers, maleic acid copolymers, and partially esterified maleic acid copolymers and the like. Moreover, acidic cellulose derivatives having a carboxyl group in a side chain, similarly, can be used. In addition thereto, compounds prepared by adding a cyclic acid anhydride to a polymer having a hydroxylic group are useful.

Of these examples, a (meth)acrylic resin having a benzyl group or an allyl group, and a carboxylic group in a side chain is preferable for an excellent balance of film strength, sensitivity, and developing property.

Moreover, urethane based polymers containing an acidic group disclosed in JP-B Nos. 7-120040, 7-120041, 7-120042, 8-12424, JP-A Nos. 63-287944, 63-287947, 1-271741, and Japanese Patent Application No. 10-116232 are advantageous in terms of printing durability and low exposure suitability with excellent strength.

Furthermore, as a water-soluble organic polymer, a polyvinyl pyrrolidone, a polyethylene oxide, or the like, is useful. Moreover, for improving the strength of a hardened film, an alcohol-soluble nylon, a polyether of 2,2-bis-(4-hydroxy phenyl)-propane and epichlorohydrine, or the like, is also useful.

The weight average molecular weight of a polymer used in the present invention is preferably 5,000 or more, and further preferably in the range of 10,000 to 300,000. The number average molecular weight is preferably 1,000 or more, and further preferably in the range of 2,000 to 250,000. The polydispersion degree (weight average molecular weight/number average molecular weight) is preferably 1 or more, and further preferably in the range of 1.1 to 10.

These polymers can be any one of a random polymer, a block polymer, a graft polymer, and the like, but a random polymer is preferable.

A polymer to be used in the present invention can be synthesized in a conventionally known method. Examples of a solvent to be used at the time of synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetoamide, toluene, ethyl acetate, methyl lactate, ethyl lactate, dimethyl sulfoxide, water and the like. These solvents can be used alone or as a mixture of two or more.

As a radical polymerization initiator to be used in the present invention at the time of synthesizing a polymer, known compounds such as an azo based initiator, or a peroxide initiator can be used.

The binder polymer used in the present invention can be used alone or as a mixture. The polymer is added in a photosensitive layer at 20 to 95% by weight, and preferably 30 to 90% by weight with respect to the total solids, in the photosensitive layer coating liquid. With an amount less than 20% by weight, image portion strength is insufficient at the time of forming an image. In contrast, with an amount more than 95% by weight, an image cannot be formed. Furthermore, a weight ratio of a compound having a radically polymerizable ethylenically unsaturated double bond and a linear organic polymer is in the range of 1/6 to 7/3.

[other components in the photosensitive layer]

In the present invention, various other compounds can be added as needed. For example, a dye with large absorption in a visible light range can be used as a coloring agent for an image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (the above-mentioned are produced by Orient Kagaku Kobyo Corp.), Victoria Pure Blue, Crystal Violet (CI142555), Methyl Violet (CI42535), Ethyl Violet, Rhodamine B (CI145170B) Malachite Green (CI42000), Methylene Blue (CI52015), and dyes disclosed in JP-A No. 62-293247. Moreover, pigments such as a phthalocyanine based pigment, an azo based pigment, carbon black, titanium oxide and the like can also be used preferably.

It is preferable to add this coloring agent since the image portion and the non-image portion can easily be distinguished after image formation. The amount ratio is 0.01 to 10% by weight with respect to the total solids of the photosensitive layer coating liquid.

Moreover, in the present invention, it is preferable to add a small amount of a thermal polymerization preventing agent for inhibiting unnecessary thermal polymerization of the compound having the radically polymerizable ethylenically unsaturated double bond in preparation of the photosensitive layer coating liquid or during storage. Examples of suitable thermal polymerization preventing agents includes hydroquinone, p-methoxyphenol, di-t-butyl-p-cresol, pyrogallol, t-butylcatechol, benzoquinone, 4,4'-thiobis (3-methyl-6-t-butyl phenol), 2,2'-methylenebis (4-methyl-6-t-butyl phenol), N-nitroso-N-phenylhydroxylamine aluminum salt, and the like. The amount of the thermal polymerization preventing agent is preferably from about 0.01% by weight to about 5% by weight with respect to total composition weight. Moreover, as needed, it is also possible to add a higher fatty acid derivative or the like, such as behenic acid or behenic acid amide, for preventing polymerization inhibition by oxygen, such that the higher fatty acid derivative is provided on the surface of the photosensitive layer in the drying process after coating. The amount of the higher fatty acid derivative is preferably from about 0.1% by weight to about 10% by weight with respect to the total composition.

Furthermore, in the photosensitive layer coating liquid of the present invention, for widening processing stability with respect to developing conditions, nonionic surfactants disclosed in JP-A Nos. 62-251740 and 3-208514, and ampho- teric surfactants disclosed in JP-A Nos. 59-121044 and 4-13149 can be added.

Specific examples of the nonionic surfactants include sorbitan tristearate, sorbitan monopalmitate, sorbitan trioleate, stearic acid monoglyceride, and polyoxyethylene nonylphenyl ether.

Specific examples of the amphoteric surfactants include alkyldi(aminoethyl)glycine, alkylpolyaminoethylglycine hydrochloride, 2-alkyl-N-carboxyethyl-N-hydroxyethylimidazolinium betaine, and N-tetradecyl-N,N-betaine type amphoteric surfactants (such as product name: AMOGEN K, produced by Daiichi Kobyo Corp.).

A ratio of the above-mentioned nonionic surfactants and/ or amphoteric surfactants in the photosensitive layer coating liquid is preferably 0.05 to 15% by weight, and more preferably 0.1 to 5% by weight with respect to the total composition.

Furthermore, in the photosensitive layer coating liquid according to the present invention, as needed, a plasticizer may be added for providing a softening property of a coat film, and the like. Examples thereof include polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and the like.

For producing a planographic printing plate original of the present invention, in general, the above-mentioned components necessary for the photosensitive layer coating liquid are dissolved in a solvent so as to be coated onto an appropriate supporting member. Examples of the solvent used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyllactone, toluene, and water and the like, but are not limited thereto. These solvents can be used alone or as a mixture. The concentration of the above-mentioned components (total solids including the additives) in the solvent is preferably 1 to 50% by weight.

The photosensitive layer coating amount (solid component) on the supporting member obtained after coating and drying varies depending on the application but, for a planographic printing plate original, in general, 0.5 to 5.0 g/m$^2$ is preferable. Various coating methods can be adopted, such as bar coater coating, spin coating, spray coating, curtain coating, dipcoating, air knife coating, blade coating, and roll coating. As the coating amount becomes smaller, apparent sensitivity becomes higher but film properties of the photosensitive layer with respect to image recording functions are lowered.

To the photosensitive layer coating liquid according to the present invention, a surfactant for improving the coating property, such as fluorine based surfactants disclosed in JP-A No. 62-170950 can be added. An amount thereof is preferably 0.01 to 1% by weight in the material solid composition of the photosensitive layer, and further preferably 0.05 to 0.5% by weight.

[Supporting Member]

The negative type image forming material according to the method of the present invention is formed by applying the above-mentioned photosensitive layer on the supporting member. The supporting member to be used herein is not particularly limited as long as it is a dimensionally-stable plate-like member. Examples thereof include paper, paper laminated with plastic (such as polyethylene, polypropylene, or polystyrene), a metal plate (such as aluminum, zinc, or copper), a plastic film (such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, or polyvinyl acetal), a paper or plastic film laminated or deposited with any of the above-mentioned metals or the like. As a preferable supporting member, a polyester film or an aluminum plate can be used.

As a supporting member to be used for the planographic printing plate original of the present invention, an aluminum plate with a light weight and an excellent surface processing property, processability, and anti-corrosion property can be used preferably. As an aluminum material to be provided for this purpose, a JIS 1050 material, a JIS 1100 material, a JIS 1070 material, an Al—Mg based alloy, an Al—Mn based metal, an Al—Mn—Mg based alloy, an Al—Zr based alloy, an Al—Mg—Si based alloy, or the like can be used.

A preferable aluminum plate is a pure aluminum plate or an alloy plate containing aluminum as the main component thereof and small amounts of other elements. Furthermore, a plastic film laminated or deposited with aluminum can be used as well. Examples of the other elements contained in the aluminum alloy include silicon, iron, manganese, copper, magnesium, copper, magnesium, chromium, zinc, bismuth, nickel, and titanium. The content of the other elements in the alloy is 10% by weight or less. For the aluminum plate, pure aluminum is preferable. However, since production of completely pure aluminum is difficult in terms of a refining technique, aluminum containing a slight amount of other elements may be used. As mentioned above, the composition of an aluminum plate is not particularly limited, but an aluminum plate of a conventionally known material can be utilized. The thickness of the above-mentioned aluminum plate is preferably about 0.1 to 0.6 mm, more preferably 0.15 to 0.4 mm, and particularly preferably 0.2 to 0.3 mm.

Prior to a roughing treatment of the surface of an aluminum plate, a degreasing treatment with a surfactant, an organic solvent or an alkaline aqueous solution can be carried out optionally, for eliminating rolling oil on the surface.

The surface roughing treatment of the aluminum plate can be carried out by various methods. Examples thereof include a mechanical roughing method, a method of dissolving and roughing the surface electrochemically, and a method of selectively dissolving the surface chemically. As a mechanical method, known methods such as a ball abrasion method, a brush abrasion method, a blast abrasion method, and a buff abrasion method can be used. Moreover, as an electrochemical roughing method, a method of using alternating or direct current in a hydrochloric acid or nitric acid electrolysis solution can be used.

The aluminum plate accordingly roughed is subjected to an alkaline etching treatment and a neutralizing treatment as needed, and then optionally subjected to an anodic oxidation treatment for improving a water retention property and wear resistance of the surface. The anodic oxidation film provided by the anodic oxidation is preferably 1.0 g/m$^2$ or more. If the anodic oxidation film amount is less than 1.0 g/m$^2$, the printing durability is insufficient or, in a case of use as a planographic printing plate, the non-image portion can easily be flawed, and ink is adhered in the flaw part such that "flaw fouling" tends to occur at the time of printing.

After application of the anodic oxidation treatment, the surface of the above-mentioned aluminum is subjected to a hydrophilic treatment as needed.

Moreover, such an aluminum supporting member may be subjected to a treatment with an organic acid or a salt thereof or application of a base coating layer for photosensitive layer coating, after the anodic oxidation treatment.

An intermediate layer may be provided for improving the adhesion property between the supporting member and the photosensitive layer. For improving the adhesion property, in general, the intermediate layer is made from, for example, a diazo resin, a phosphoric acid compound adsorbed to aluminum, or the like. The thickness of the intermediate layer can be set freely, but should be a thickness capable of executing a homogeneous bond forming reaction with the upper layer, which is photosensitive layer, at the time of exposure. In general, a coating ratio as a dried solid is preferably about 1 to 100 mg/m$^2$, and particularly preferably 5 to 40 mg/m$^2$. The ratio of the diazo resin in the intermediate layer is 30 to 100%, and preferably 60 to 100% by weight.

After application of the above-mentioned treatment or base coat on the supporting member surface, a back coat can be provided on the reverse side of the supporting member as needed. As the back coat, an organic polymer compound disclosed in JP-A No. 5-45885, or a metallic oxide coating layer obtained by hydrolysis and polycondensation of an organic or inorganic compound disclosed in JP-A No. 6-35174 can be used preferably.

Preferable characteristics of the planographic printing plate supporting member include a 0.10 to 1.2 μm center line average coarseness. With a coarseness less than 0.10 μm, the adhesion property with the photosensitive layer is lowered, which causes a drastic reduction of the printing durability. In contrast, with a coarseness more than 1.2 μm, an image fouling at the time of printing is deteriorated. Furthermore, a color density of the supporting member is 0.15 to 0.65 as a reflection density value. If the supporting member is whiter than 0.15, halation at the time of image exposure is too strong, which causes trouble in image formation. In contrast, if the supporting member is blacker than 0.65, the image portions can hardly be seen in a plate checking operation after development and thus a plate checking property is extremely poor.

By forming the above-mentioned photosensitive layer, and other optional layers such as the surface protecting layer and the back coat layer, on the supporting member obtained by executing predetermined treatments as mentioned above, the negative type image forming material to be applied in the method of the present invention can be obtained. In the method of the present invention, the image is recorded on the image forming material by the infrared laser. Moreover, recording by an ultraviolet ray lamp or thermal recording by a thermal head is also possible. In the present invention, image exposure by a solid laser or a semiconductor laser for emitting infrared ray of a 760 nm to 1,200 nm wavelength is preferable. The laser output is preferably 100 mW or more. For shortening the exposure time, a multi-beam laser is preferably used. Moreover, the exposure time per one pixel is preferably less than 20μ seconds. The energy to be radiated to the recording material is preferably 10 to 300 mJ/cm$^2$.

After exposure by the infrared laser, the image forming material is developed by the weak alkaline aqueous solution featured in the present invention explained above in detail.

The image forming material subjected to the developing treatment with the above-described developer and replenisher is used as the planographic printing plate after optionally being subjected to a post-treatment with washing water, a rinse solution containing a surfactant or the like, and/or a desensitizing solution containing gum arabic, or a starch derivative.

Recently, automatic developing machines for planographic printing plates have been used widely in the plate making and printing industry for rationalizing and standardizing plate making operations. The automatic developing machines, in general, comprise a developing part, a post-treatment part, a conveying device for a printing plate, vessels for each processing liquid, and a spray device, wherein a developing treatment is executed by spraying each processing liquid, which is pumped up by a pump, from a spray nozzle to the printing plate after exposure while the printing plate is being conveyed horizontally. Furthermore, a developing treatment method of soaking and conveying the printing plate in a processing liquid vessel filled with a processing liquid by a guide roll in the liquid, or the like, has also become known recently. In such an automatic treatment, the printing plate can be processed while replenishing a replenisher to each processing liquid, according to processing amount and working time and the like. Moreover, it is also possible to sense electric conductivity of the processing liquid with a sensor for automatic replenishment.

Furthermore, a so-called discarding processing method, using a substantially unused processing liquid for the process, can also be adopted.

According to the method of the present invention, since there is no risk of deterioration of the developing property by aging due to carbon gas, or deterioration of the printing durability due to a developer, the method of the present invention can be preferably applied in any of these automatic developing machines.

After optional coating with a desensitizing gum, a planographic printing plate accordingly obtained can be provided to a printing step. In the case that a planographic printing plate with a higher printing durability is required, a burning treatment is further applied.

In the case of applying a burning treatment, it is preferable to treat the planographic printing plate with a counter-etching solution as disclosed in JP-B Nos. 61-2518, 55-28062, and JP-A Nos. 62-31859 and 61-159655 before the burning treatment.

As a method therefor, a method of coating a counter-etching solution on the planographic printing plate with a sponge or absorbent cotton impregnated with the counter-etching solution, or of soaking the printing plate in a tray filled with the counter-etching solution for application thereof, an application method with an automatic coater, or the like can be adopted. Moreover, by homogenizing application amounts with a squeegee or a squeegee roller after application, a more preferable result can be provided.

As an application amount of a counter-etching solution, in general, 0.03 to 0.8 $g/m^2$ (dry weight) is appropriate.

The planographic printing plate with the counter-etching solution applied thereto is, after drying, as needed, heated at a high temperature in a burning processor (such as a burning processor BP-1300 commercially available from Fuji Photo Film Co., Ltd.), or the like. A heating temperature and duration depend on the kinds of components forming the image, but are preferably in the range of 180 to 300° C. and 1 to 20 minutes, respectively.

The planographic printing plate subjected to the burning treatment may optionally be subjected to conventionally executed treatments such as washing with water, and gum coating as needed. In the case that a counter-etching solution containing a water-soluble polymer compound or the like was used, a so-called desensitizing treatment, such as gum coating, can be omitted.

The planographic printing plate obtained by the image forming method of the present invention can be mounted in an offset printing press or the like so as to be used for printing a large number of copies.

EXAMPLES

Hereinafter, the present invention will be explained in detail with reference to examples, but the present invention is not limited thereto.

Example 1
[Production of a Supporting Member]

A molten product of a JIS A1050 alloy containing 99.5% of more of aluminum, 0.30% of Fe, 0.10% of Si, 0.02% of Ti, and 0.013% of Cu was subjected to a purification treatment and casted. As the purification treatment, a degassing treatment was applied for eliminating unnecessary gas such as a hydrogen in the molten product, and a ceramic tube filter treatment was further applied. As a casting method, a DC casting method was adopted. A solidified 500 mm plate thickness ingot was faced 10 mm from the surface, and a homogenizing treatment was executed at 550° C. for 10 hours so as to prevent an inter-metal compound from growing. Then, after heat rolling at 400° C., and annealing at 500° C. for 60 seconds in a continuous annealing furnace, cold rolling was executed so as to obtain a 0.30 mm plate thickness aluminum rolled plate. By controlling a roughness of a rolling roll, a center line average surface coarseness Ra after cold rolling was controlled to be 0.2 μm. Thereafter, the plate was processed by a tension leveler to improve flatness.

Next, a surface treatment for providing a planographic printing plate supporting member was executed.

First, to eliminate rolling oil on the aluminum plate surface, a degreasing treatment was executed with a 10% aqueous solution of sodium aluminate at 50° C. for 30 seconds, and a neutralizing and desmutting treatment was executed with a 30% sulfuric acid aqueous solution at 50° C. for 30 seconds.

Next, to improve an adherence property between the supporting member and the photosensitive layer as well as to provide a water retention property to a non-image portion, a so-called graining treatment for roughing the surface of the supporting member was executed. Electrolytic graining was executed by providing a 240 $C/dm^2$ anode side electric amount with a 20 $A/dm^2$ current density and a 1:1 duty ratio alternating wave form by an indirect feeder cell while keeping an aqueous solution containing 1% nitric acid and 0.5% aluminum nitrate at 45° C., and providing the aluminum web in the aqueous solution. Thereafter, an etching treatment was executed with a 10% sodium aluminate aqueous solution at 50° C. for 30 seconds, and a neutralizing and desmutting treatment was executed with a 30% sulfuric acid aqueous solution at 50° C. for 30 seconds.

Furthermore, to improve wear resistance, chemical resistance, and a water retention property, an oxidized film was formed on the supporting member by anodic oxidation. A 2.5 $g/m^2$ anodic oxidization film was produced by executing an electrolytic treatment with a 14 $A/dm^2$ direct current by an indirect feeder cell, with a 20% sulfuric acid aqueous solution used as an electrolyte at 35° C., and conveying the aluminum web in the electrolyte.

Thereafter, in order to ensure a hydrophilic property of the printing plate non-image portion, a silicate treatment was executed. In the treatment, a 1.5% aqueous solution of No. 3 sodium silicate was maintained at 70° C., and the aluminum web was conveyed so as to have a 15 seconds contact time, followed by washing with water. The Si adhesion amount was 10 $mg/M^2$. The Ra (center line surface coarseness) of the supporting member accordingly produced was 0.25 μm.

[Base Coat]

Next, the aluminum supporting member was coated with a below-described base coating liquid by a wire bar, and dried at 90° C. for 30 seconds with a hot air drier. The coating amount after drying was 10 $mg/m^2$.

<Under Coat Liquid>

| | |
|---|---|
| a copolymer of an ethylmethacrylate and sodium 2-acrylamide-2-methyl-1-propane sulfonate with a 75:15 mole ratio | 0.1 g |
| 2-aminoethyl phosphonic acid | 0.1 g |
| methanol | 50 g |
| ion exchange water | 50 g |

[Photosensitive Layer]

Then, a below-described photosensitive layer coating liquid [P] was prepared, and applied to the above-mentioned base-coated aluminum plate with a wire bar. A drying operation was executed at 115° C. for 45 seconds by a hot air drier to form a photosensitive layer and thereby obtain a negative type planographic printing plate original [P-1] of Example 1. A coating amount after drying was in the range of 1.2 to 1.3 g/m².

<Photosensitive Layer Coating Liquid [P]>

| | |
|---|---|
| infrared ray absorbing agent [IR-6] | 0.08 g |
| onium salt [OI-6] | 0.30 g |
| dipentaerythritol hexaacrylate | 1.00 g |
| copolymer of allylmethacrylate and methacrylic acid with an 80:20 mole ratio (weight average molecular weight: 120,000) | 1.00 g |
| naphthalene sulfonate of Victoria Pure Blue | 0.04 g |
| fluorine based surfactant (MEGAFACE F-176, produced by Dainippon Ink Kagaku Kogyo, Corp.) | 0.01 g |
| methylethyl ketone | 9.0 g |
| methanol | 10.0 g |
| 1-methoxy-2-propanol | 8.0 g |

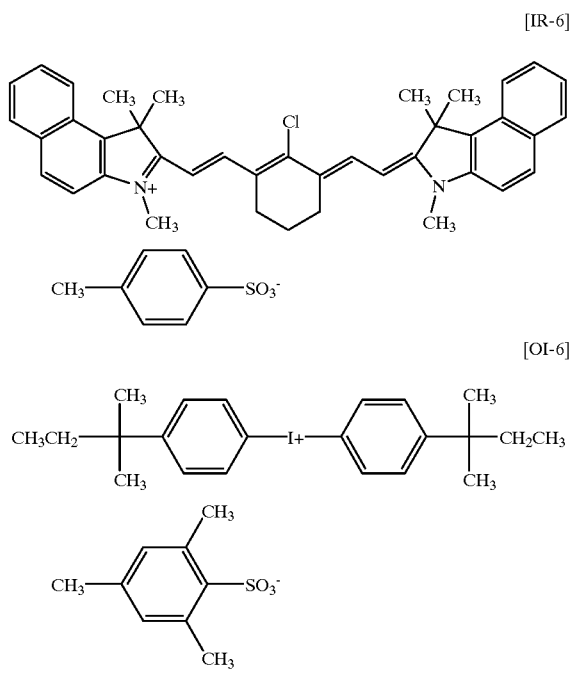

[IR-6]

[OI-6]

[Exposure]

The obtained negative type planographic printing plate original [P-1] was exposed with a TRENDSETTER 3244VFS, produced by Creo Corp, equipped with a water cooling type 40 W infrared semiconductor laser under 90 W output, 210 rpm outer surface drum rotational frequency, 100 mJ/cm² surface energy, and 2,400 dpi resolution conditions.

[Developing Treatment]

After the exposure, a developing treatment was applied by an automatic developing machine SUTABURON 900N, produced by Fuji Photo Film Corp. As a developer, developer [1] of the below-described composition (pH at 25° C.: 9.9) was used both for the preparation liquid and the replenisher. A developing bath was set to 30° C. Moreover, as a finisher, a 1:1 water diluted solution of FN-6, produced by Fuji Photo Film Corp., was used. The pH of the below-described developer was a value measured at 25° C.

<Developer [1]>

| | |
|---|---|
| monohydrate of sodium carbonate | 10 g |
| potassium hydrogencarbonate | 10 g |
| sodium isopropylnaphthalene sulfonate | 15 g |
| sodium dibutylnaphthalene sulfonate | 15 g |
| sodium salt of ethyleneglycol mononaphthyl ether monosulfate | 10 g |
| sodium sulfite | 1 g |
| ethylene diamine tetraacetate tetrasodium | 0.1 g |
| ion exchange water | 938.9 g |

[Evaluation of Printing Durability and Image Fouling]

Next, the planographic printing plate [P-1] was provided for printing with a printer RISURON, produced by Komori Corp. At the time, how many sheets with a sufficient amount of ink could be obtained after the start of printing matter was evaluated by visual observation. Moreover, an image fouling state of the non-image portion at the time was observed visually.

As a result, 80,000 sheets of good printed matter were obtained. Furthermore, generation of fouling was not found in the non-image portion of the obtained printed matter.

[Evaluation of Aging Stability]

In the conditions of Example 1, the developing operation was executed on 10 m² per day continuously for 20 days. Developing failure was not found in the obtained planographic printing plates.

Comparative Example 1

By the same process as in Example 1, except that a developer [2] (pH 9.9) of the below-described composition was used instead of the above-mentioned developer [P-1], a negative type planographic printing plate [P-2] of Comparative Example 1 was obtained.

<Developer [2]>

| | |
|---|---|
| monohydrate of sodium carbonate | 10 g |
| potassium hydrogencarbonate | 10 g |
| sodium sulfite | 1 g |
| ethylene diamine tetraacetate tetrasodium | 0.1 g |
| ion exchange water | 938.9 g |

Next, the planographic printing plate [P-2] was provided for printing as in Example 1. According to visual evaluation of the obtained printed matters, generation of fouling derived from a residual film caused by developing failure was observed in the non-image portion of the printed matter.

Comparative Example 2

By the same process as in Example 1, except that a developer [3] (pH 10.0) of the below-described composition was used instead of the above-mentioned developer [P-1], a negative type planographic printing plate [P-3] of Comparative Example 2 was obtained.

<Developer [3]>

| | |
|---|---|
| monohydrate of sodium carbonate | 10 g |
| potassium hydrogencarbonate | 10 g |
| benzyl alcohol | 20 g |
| sodium sulfite | 1 g |
| ethylene diamine tetraacetate tetrasodium | 0.1 g |
| ion exchange water | 938.9 g |

Next, the planographic printing plate [P-3] was provided for printing as in Example 1.

As a result, 40,000 sheets of good printed matter were obtained. Furthermore, generation of fouling was not found in the non-image portion of the obtained printed matter.

From the above-mentioned result, Example 1, developed with a weak alkaline aqueous solution containing a carbonate and a surfactant, was excellent in terms of the printing durability and the image forming property (developing property), and furthermore, it was capable of developing stably for a long time. In contrast, it was learned that in Comparative Example 1, using a carbonate but not containing a surfactant, fouling was caused by developing image failure, and in Comparative Example 2, containing an organic solvent, even though the developing property was sufficient, the printing property was lower than in Example 1.

As heretofore mentioned, according to the present invention, an excellent image forming method can be provided. The method can be applied to a negative type image forming material capable of recording directly from digital data of a computer or the like by using a solid laser or semiconductor laser that emits infrared radiation. Further, the method provide an excellent image forming property and do not cause deterioration of developing property or printing durability caused by aging, which deteriorations are from the characteristics of a developer.

What is claimed is:

1. An image forming method comprising the steps of:
   preparing a negative type image forming material including a supporting member and at least one photosensitive layer containing (A) an infrared ray absorbing agent, (B) a radical generating agent, (C) a radically polymerizable monomer, and (D) a binder polymer;
   exposing the negative type image forming material image-wise by an infrared laser; and
   developing the negative type image forming material with a weak alkaline aqueous solution having a pH value in a range from 7 to 12 and containing a carbonate and a surfactant.

2. The image forming method according to claim 1, wherein the surfactant is an anionic surfactant.

3. The image forming method according to claim 1, wherein the surfactant is one of a sulfonate and an anionic surfactant including a salt of a monosulfate.

4. The image forming method according to claim 1, wherein an amount of the surfactant is 0.2 to 30% by weight with respect to a developer.

5. The image forming method according to claim 1, wherein the carbonate is at least one selected from the group consisting of carbonates and hydrogen carbonates of alkaline metals, carbonates and hydrogen carbonates of alkaline earth metals, and carbonates and hydrogen carbonates of ammonium.

6. The image forming method according to claim 1, wherein an amount of the carbonate is 0.1 to 10% by weight with respect to one of a developer and a replenisher.

7. The image forming method according to claim 1, wherein a pH value of the weak alkaline aqueous solution is from 8 to 11.

8. The image forming method according to claim 1, wherein the radically polymerizable compound has at least one ethylenically unsaturated double bond.

9. The image forming method according to claim 1, wherein the binder polymer is a linear organic polymer which is soluble or swellable in water or weak alkaline water.

10. The image forming method according to claim 1, the method further comprises at least one step selected from the group consisting of preparing a photosensitive layer coating liquid, coating a photosensitive layer coating liquid on a supporting member, drying a photosensitive layer coating liquid that has been applied on a supporting member to thereby obtain the negative type image forming material, and performing a post-treatment after development.

11. The image forming method according to claim 1, wherein the infrared ray absorbing agent is a cyanine dye.

12. The image forming method according to claim 1, wherein the radical generating agent is an onium salt.

* * * * *